(12) United States Patent
Fujita et al.

(10) Patent No.: US 10,047,285 B2
(45) Date of Patent: Aug. 14, 2018

(54) WAVELENGTH CONVERSION MEMBER AND LIGHT EMITTING DEVICE USING SAME

(71) Applicant: NIPPON ELECTRIC GLASS CO., LTD., Otsu-shi, Shiga (JP)

(72) Inventors: Naoki Fujita, Otsu (JP); Tamio Ando, Otsu (JP); Masaru Iwao, Otsu (JP); Tadahito Furuyama, Otsu (JP); Shunsuke Fujita, Otsu (JP); Hiroyuki Shimizu, Otsu (JP); Masaaki Kadomi, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 23 days.

(21) Appl. No.: 15/311,535

(22) PCT Filed: May 8, 2015

(86) PCT No.: PCT/JP2015/063290
§ 371 (c)(1),
(2) Date: Nov. 16, 2016

(87) PCT Pub. No.: WO2015/178223
PCT Pub. Date: Nov. 26, 2015

(65) Prior Publication Data
US 2017/0137706 A1    May 18, 2017

(30) Foreign Application Priority Data

May 21, 2014  (JP) .................................. 2014-104995
Jun. 25, 2014  (JP) .................................. 2014-129818
Mar. 25, 2015  (JP) .................................. 2015-061937

(51) Int. Cl.
*F21V 23/02*    (2006.01)
*C09K 11/08*    (2006.01)
(Continued)

(52) U.S. Cl.
CPC ................ *C09K 11/08* (2013.01); *C09K 5/14* (2013.01); *C09K 11/02* (2013.01); *F21K 9/64* (2016.08);
(Continued)

(58) Field of Classification Search
USPC .......................................... 362/84, 317, 260
See application file for complete search history.

(56) References Cited

U.S. PATENT DOCUMENTS 5,998,925 A    12/1999  Shimizu et al.
6,069,440 A    5/2000   Shimizu et al.
(Continued)

FOREIGN PATENT DOCUMENTS

JP    2000-208815 A    7/2000
JP    2003-258308 A    9/2003
(Continued)

OTHER PUBLICATIONS

Official Communication issued in International Patent Application No. PCT/JP2015/063290, dated Jun. 16, 2015.

*Primary Examiner* — Vip Patel
(74) *Attorney, Agent, or Firm* — Keating and Bennett, LLP

(57) ABSTRACT

Provided is a wavelength conversion member capable of reducing the decrease in luminescence intensity with time and the melting of a component material when irradiated with light of a high-power LED or LD and providing a light emitting device using the wavelength conversion member. The wavelength conversion member (11) includes a laminate that includes: a phosphor layer (1); and light-transmissive heat dissipation layers (2) formed on both surfaces of the phosphor layer (1) and having a higher thermal conductivity than the phosphor layer (1).

15 Claims, 7 Drawing Sheets

(51) Int. Cl.
  *C09K 5/14* (2006.01)
  *C09K 11/02* (2006.01)
  *H01L 33/64* (2010.01)
  *H01L 33/50* (2010.01)
  *H01L 33/60* (2010.01)
  *F21K 9/64* (2016.01)
  *F21V 9/16* (2006.01)
  *F21V 9/30* (2018.01)
  *F21Y 115/30* (2016.01)

(52) U.S. Cl.
  CPC .................. *F21V 9/16* (2013.01); *F21V 9/30* (2018.02); *H01L 33/502* (2013.01); *H01L 33/60* (2013.01); *H01L 33/641* (2013.01); *F21Y 2115/30* (2016.08); *H01L 2933/0091* (2013.01)

(56) References Cited

U.S. PATENT DOCUMENTS

| | | |
|---|---|---|
| 2008/0187746 A1 | 8/2008 | De Graaf et al. |
| 2011/0090703 A1 | 4/2011 | Ishimori et al. |
| 2012/0068213 A1 | 3/2012 | Zhang et al. |
| 2012/0094083 A1 | 4/2012 | Nakamura et al. |
| 2013/0292728 A1 | 11/2013 | Ishimori et al. |

FOREIGN PATENT DOCUMENTS

| | | |
|---|---|---|
| JP | 2007-048864 A | 2/2007 |
| JP | 2008-169348 A | 7/2008 |
| JP | 2011-071404 A | 4/2011 |
| JP | 2011-519149 A | 6/2011 |
| JP | 4895541 B2 | 3/2012 |
| JP | 2012-094419 A | 5/2012 |
| JP | 2013-543525 A | 12/2013 |
| WO | 2012/040046 A1 | 3/2012 |

[FIG. 1]
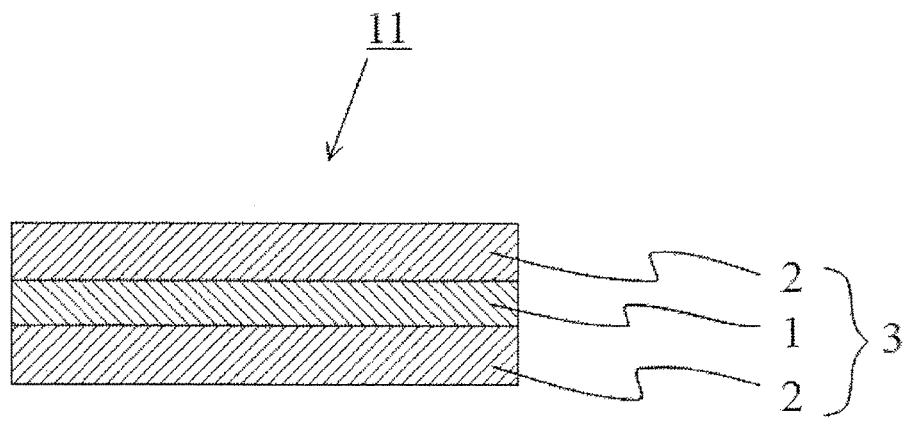
[FIG. 2]
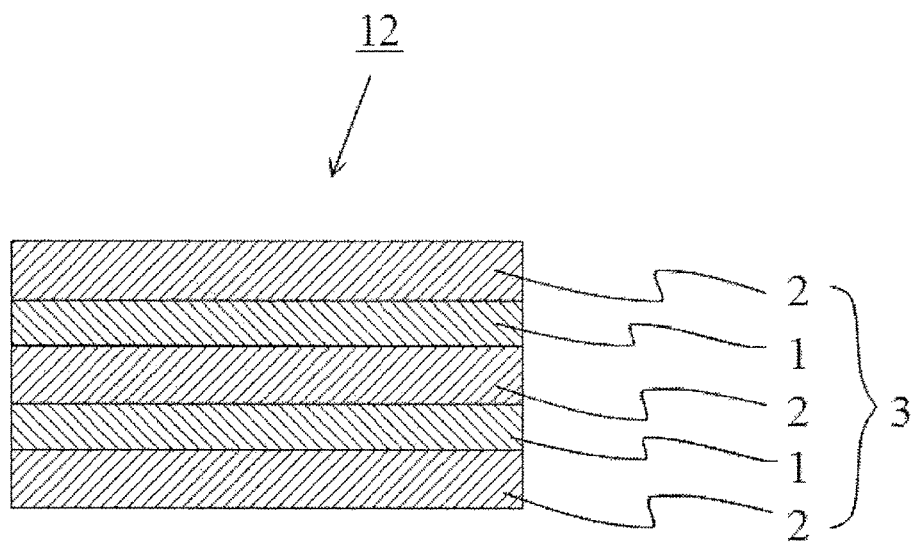

[FIG. 3]
(a)
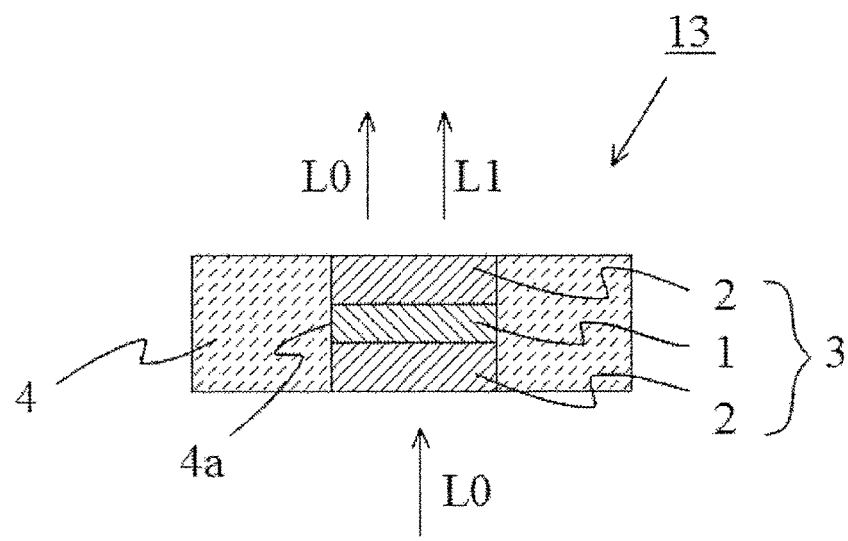
(b)

[FIG. 4]
(a)
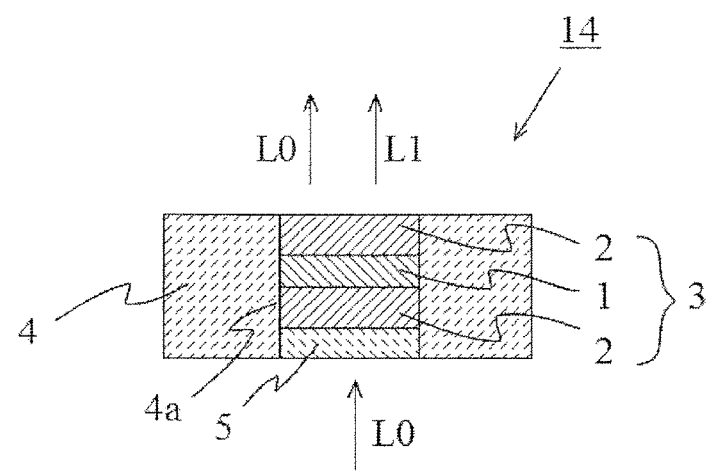
(b)
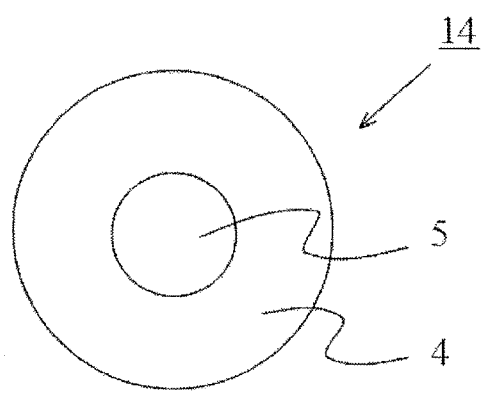
(c)
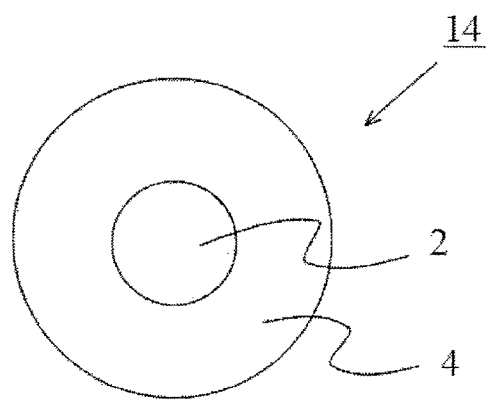

[FIG. 5]
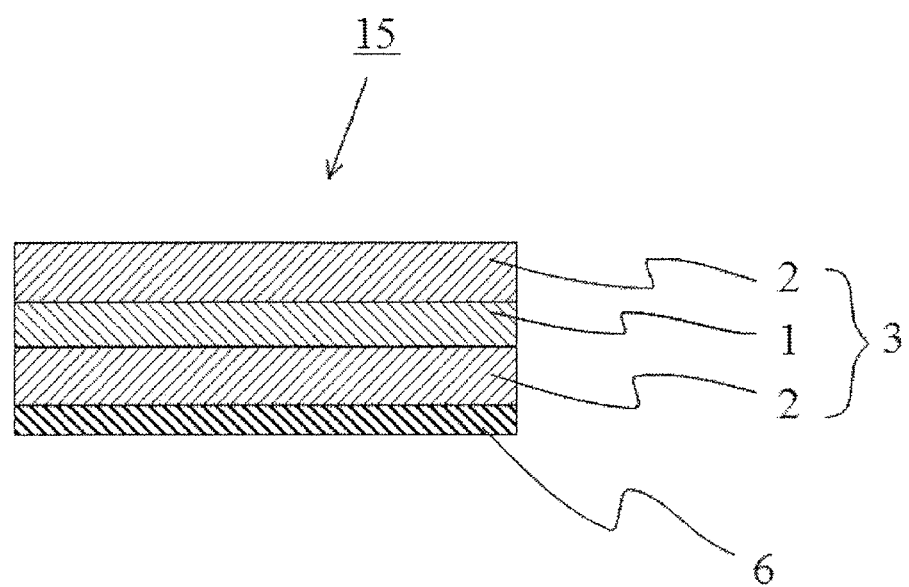

[FIG. 6]
(a)
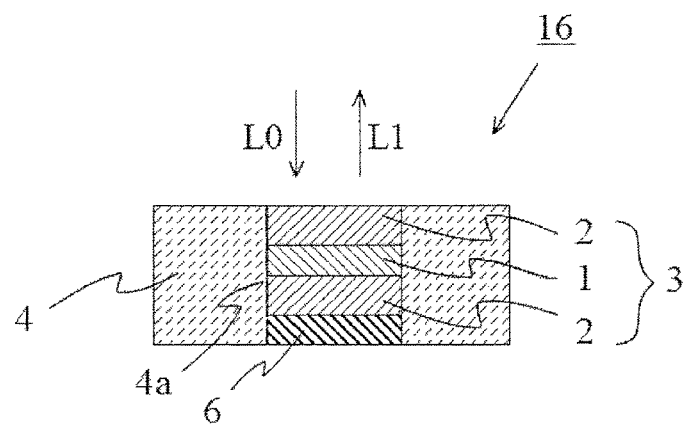
(b)
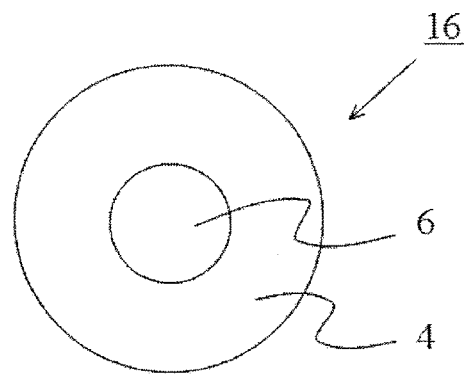
(c)
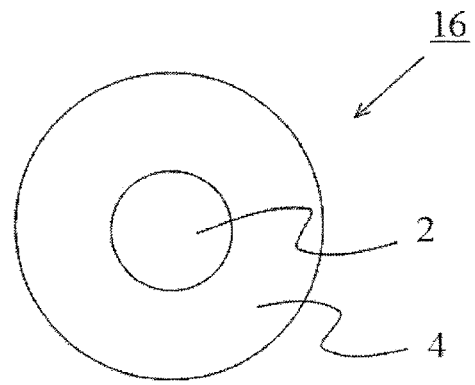

[FIG. 7]
(a)
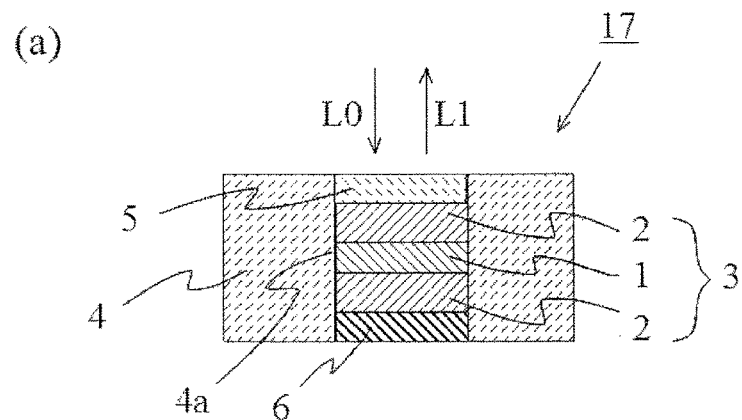
(b)
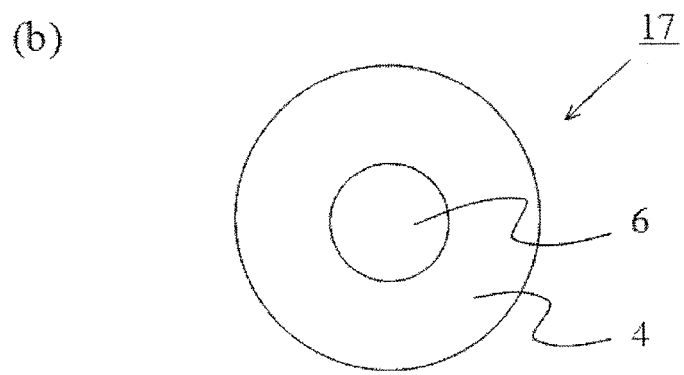
(c)
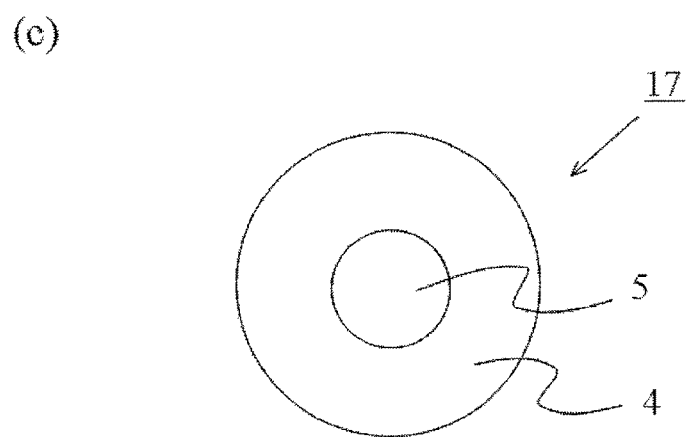

[FIG. 8]
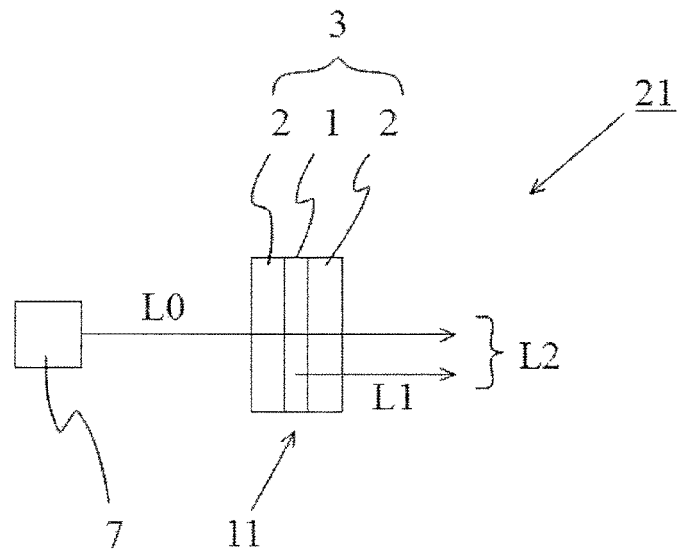
[FIG. 9]
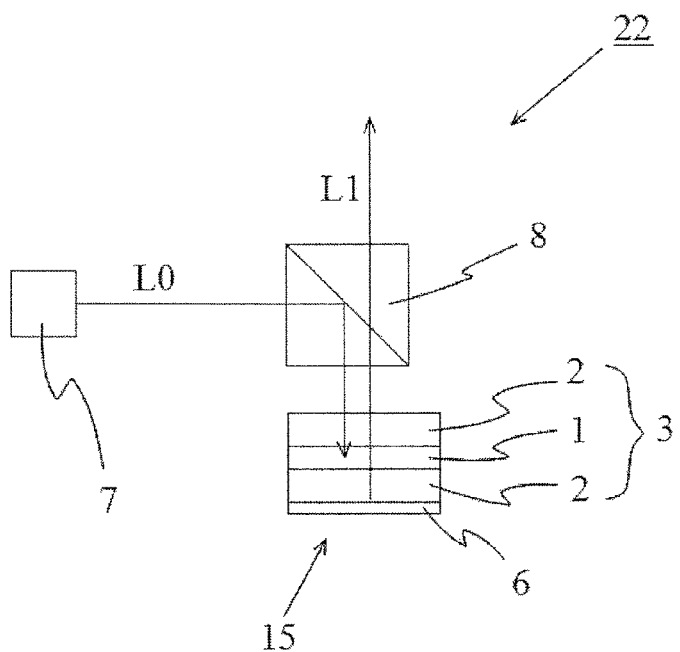

WAVELENGTH CONVERSION MEMBER AND LIGHT EMITTING DEVICE USING SAME

TECHNICAL FIELD

The present invention relates to wavelength conversion members for converting the wavelength of light emitted from light emitting diodes (LEDs), laser diodes (LDs) or the like to another wavelength and light emitting devices using the same.

BACKGROUND ART

Recently, attention has been increasingly focused on light emitting devices using LEDs or LDs, as next-generation light emitting devices to replace fluorescence lamps and incandescent lamps, from the viewpoint of their low power consumption, small size, light weight, and easy adjustment to light intensity. For example, Patent Literature 1 discloses, as an example of such a next-generation light emitting device, a light emitting device in which a wavelength conversion member is disposed on an LED for emitting a blue light and absorbs part of the light from the LED to convert it to a yellow light. This light emitting device emits a white light which is a synthetic light of the blue light emitted from the LED and the yellow light emitted from the wavelength conversion member.

As a wavelength conversion member, there is conventionally used a wavelength conversion member in which inorganic phosphor powder is dispersed in a resin matrix. However, when such a wavelength conversion member is used, there arises a problem that the resin is deteriorated by light from the LED to make it likely that the luminance of the light emitting device will be low. Particularly, the wavelength conversion member has a problem in that the molded resin is deteriorated by heat and high-energy short-wavelength (blue to ultraviolet) light emitted from the LED to cause discoloration or deformation.

To cope with the above, a wavelength conversion member is proposed which is formed of an absolutely inorganic solid in which a phosphor is dispersed and set in, instead of resin, a glass matrix (see, for example, Patent Literatures 2 and 3). This wavelength conversion member has the feature that glass as the matrix is less likely to be deteriorated by heat and irradiation light from the LED and therefore less likely to cause problems of discoloration and deformation.

CITATION LIST

Patent Literature

[PTL 1]
JP-A-2000-208815
[PTL 2]
JP-A-2003-258308
[PTL 3]
Japanese Patent No. 4895541

SUMMARY OF INVENTION

Technical Problem

Recently, the power of an LED or an LD for use as the light source is increasing for the purpose of providing higher power. Along with this, the temperature of the wavelength conversion member rises due to heat from the light source and heat emitted from the phosphor irradiated with excitation light, resulting in the problem that the luminescence intensity decreases with time (temperature quenching). Furthermore, in some cases, the temperature rise of the wavelength conversion member becomes significant, which may melt a component material (such as the glass matrix).

In view of the foregoing, the present invention has an object of providing a wavelength conversion member capable of reducing the decrease in luminescence intensity with time and the melting of a component material when irradiated with light of a high-power LED or LD and providing a light emitting device using the wavelength conversion member.

Solution to Problem

A wavelength conversion member according to the present invention comprises a laminate that includes: a phosphor layer; and light-transmissive heat dissipation layers formed on both surfaces of the phosphor layer and having a higher thermal conductivity than the phosphor layer.

With the above configuration, heat generated in the phosphor layer when the wavelength conversion member is irradiated with excitation light emitted from the light source is efficiently released to the outside from the light-transmissive heat dissipation layers formed on both the surfaces of the phosphor layer. Thus, the temperature rise of the phosphor layer can be reduced to reduce the decrease in luminescence intensity with time and the melting of the component material. Particularly, when an LD capable of emitting high-intensity light is used as the light source, the temperature of the phosphor layer is likely to rise. Even in such a case, the present invention enables heat generated in the phosphor layer to be efficiently released to the outside.

The term "light-transmissive" of the light-transmissive heat dissipation layer means that the layer can transmit the excitation light and fluorescence emitted from the phosphor layer.

The wavelength conversion member according to the present invention preferably comprises a laminate in which the two or more phosphor layers and the three or more light-transmissive heat dissipation layers are alternately stacked.

With the above configuration, since the wavelength conversion member has two or more phosphor layers, the luminescence intensity can be increased. Simultaneously, since the three or more light-transmissive heat dissipation layers and the phosphor layers are alternatively stacked, the path along which heat generated in the phosphor layers is released to the outside can be sufficiently secured, thus reducing the temperature rise of the phosphor layers.

In the wavelength conversion member according to the present invention, the light-transmissive heat dissipation layer is preferably made of a light-transmissive ceramic.

In the wavelength conversion member according to the present invention, the light-transmissive ceramic is preferably at least one selected from the group consisting of an aluminum oxide-based ceramic, a zirconia oxide-based ceramic, an aluminum nitride-based ceramic, a silicon carbide-based ceramic, a boron nitride-based ceramic, a magnesium oxide-based ceramic, a titanium oxide-based ceramic, a niobium oxide-based ceramic, a zinc oxide-based ceramic, and a yttrium oxide-based ceramic.

In the wavelength conversion member according to the present invention, the phosphor layer is preferably formed of phosphor powder dispersed in an inorganic binder.

With the above configuration, a wavelength conversion member can be obtained in which phosphor powder is uniformly dispersed in the phosphor layer and which has excellent thermal resistance. Furthermore, the luminescent color can be easily controlled by appropriately changing the concentration or type of the phosphor powder in the phosphor layer.

In the wavelength conversion member according to the present invention, the phosphor layer is preferably made of a polycrystalline ceramic phosphor.

With the above configuration, the thermal resistance of the wavelength conversion member can be further increased.

In the wavelength conversion member according to the present invention, the phosphor layers preferably include a layer formed of phosphor powder dispersed in an inorganic binder and a layer made of a polycrystalline ceramic phosphor.

In the wavelength conversion member according to the present invention, a heat dissipating member having a higher thermal conductivity than the phosphor layer is preferably provided on a lateral periphery of the laminate.

With the above configuration, heat generated in the phosphor layer is released through the light-transmissive heat dissipation layers to the outside or directly transferred to the heat dissipating member and then released from the heat dissipating member to the outside. As a result, heat generated in the phosphor layer can be more efficiently released to the outside.

In the wavelength conversion member according to the present invention, the heat dissipating member is preferably made of a metal or a ceramic.

In the wavelength conversion member according to the present invention, a reflective layer is preferably provided at the interface between the laminate and the heat dissipating member.

With the above configuration, the leakage of excitation light and fluorescence from the lateral periphery of the laminate can be further reduced, so that the luminescence intensity of the wavelength conversion member can be further increased.

In the wavelength conversion member according to the present invention, a scattering layer is preferably provided on an incident surface of the laminate through which the excitation light enters the laminate.

With the above configuration, the excitation light is first scattered in the scattering layer and then applied to the phosphor layer, which makes it possible to reduce the energy density of the excitation light applied to the phosphor layer. As a result, excessive temperature rise of the phosphor layer can be reduced.

In the wavelength conversion member according to the present invention, a reflective layer is preferably formed on one outermost surface of the laminate opposite to the other outermost surface through which the excitation light enters the laminate.

In this manner, the wavelength conversion member can be used as a reflective wavelength conversion member.

In the wavelength conversion member according to the present invention, the reflective layer is preferably a metallic layer, a dielectric multi-layer or a reflective glass layer.

A light emitting device according to the present invention includes the above-described wavelength conversion member and a light source operable to irradiate the wavelength conversion member with excitation light.

In the light emitting device according to the present invention, the light source is preferably a laser diode.

Advantageous Effects of Invention

The present invention enables to provide a wavelength conversion member capable of reducing the decrease in luminescence intensity with time and the melting of a component material when irradiated with light of a high-power LED or LD.

BRIEF DESCRIPTION OF DRAWINGS

FIG. 1 is a schematic cross-sectional view showing a wavelength conversion member according to a first embodiment of the present invention.

FIG. 2 is a schematic cross-sectional view showing a wavelength conversion member according to a second embodiment of the present invention.

FIG. 3(*a*) is a schematic cross-sectional view showing a wavelength conversion member according to a third embodiment of the present invention. FIG. 3(*b*) is a schematic plan view of the wavelength conversion member of (a).

FIG. 4 is a schematic cross-sectional view showing a wavelength conversion member according to a fourth embodiment of the present invention.

FIG. 5 is a schematic cross-sectional view showing a wavelength conversion member according to a fifth embodiment of the present invention.

FIG. 6(*a*) is a schematic cross-sectional view showing a wavelength conversion member according to a sixth embodiment of the present invention. FIG. 6(*b*) is a schematic plan view of the wavelength conversion member of (a) when viewed from the opposite side to an incident surface thereof through which excitation light L0 enters the wavelength conversion member. FIG. 6(*c*) is a schematic plan view of the wavelength conversion member of (a) when viewed from the incident surface through which excitation light L0 enters the wavelength conversion member.

FIG. 7(*a*) is a schematic cross-sectional view showing a wavelength conversion member according to a seventh embodiment of the present invention. FIG. 7(*b*) is a schematic plan view of the wavelength conversion member of (a) when viewed from the opposite side to an incident surface thereof through which excitation light L0 enters the wavelength conversion member. FIG. 7(*c*) is a schematic plan view of the wavelength conversion member of (a) when viewed from the incident surface through which excitation light L0 enters the wavelength conversion member.

FIG. 8 is a schematic side view showing a light emitting device in which the wavelength conversion member according to the first embodiment of the present invention is used.

FIG. 9 is a schematic side view showing a light emitting device in which the wavelength conversion member according to the fifth embodiment of the present invention is used.

DESCRIPTION OF EMBODIMENTS

Hereinafter, embodiments of the present invention will be described in detail with reference to the drawings. However, the present invention is not at all limited to the following embodiments.

(1) Wavelength Conversion Member According to First Embodiment

FIG. 1 is a schematic cross-sectional view showing a wavelength conversion member according to a first embodiment of the present invention. The wavelength conversion member 11 is formed of a laminate 3 that includes: a phosphor layer 1; and light-transmissive heat dissipation layers 2 formed on both surfaces of the phosphor layer 1. The wavelength conversion member 11 according to this embodiment is a transmissive wavelength conversion member. When one of the light-transmissive heat dissipation layers 2 is irradiated with excitation light, part of the incident excitation light is converted in wavelength to fluorescence by the phosphor layer 1. The fluorescence is radiated, together with transmitting part of the excitation light, through the other light-transmissive heat dissipation layer 2 to the outside. Heat generated by the irradiation of the phosphor layer 1 with the excitation light is efficiently released through each of the light-transmissive heat dissipation layers 2 to the outside. Thus, an undue temperature rise of the phosphor layer 1 can be reduced.

The phosphor layer 1 is preferably formed of a phosphor dispersed in an inorganic binder. By doing so, the phosphor can be uniformly dispersed in the phosphor layer 1. Furthermore, the wavelength conversion member 11 can be improved in thermal resistance. Examples of the inorganic binder that can be cited include glass and polysilazane. In view of the thermal resistance of the phosphor, the preferred glass for use is glass having a softening point of 250° C. to 1000° C. and more preferably a softening point of 300° C. to 850° C. Specific examples of the glass that can be cited include borosilicate-based glasses and phosphate-based glasses.

No particular limitation is placed on the type of the phosphor so long as it emits fluorescence upon entry of excitation light. Specific examples of the phosphor that can be cited include at least one selected from the group consisting of, for example, oxide phosphor, nitride phosphor, oxynitride phosphor, chloride phosphor, oxychloride phosphor, sulfide phosphor, oxysulfide phosphor, halide phosphor, chalcogenide phosphor, aluminate phosphor, halophosphoric acid chloride phosphor, and garnet-based compound phosphor. With the use of a blue light as the excitation light, a phosphor capable of emitting as the fluorescence, for example, a green light, a yellow light or a red light can be used.

The average particle size ($D_{50}$) of the phosphor is preferably 1 to 50 μm and more preferably 5 to 25 μm. If the average particle size of the phosphor is too small, the luminescence intensity is likely to be decreased. On the other hand, if the average particle size of the phosphor is too large, the luminescent color tends to be uneven.

The content of the phosphor in the phosphor layer 1 is preferably 5 to 80% by volume, more preferably 10 to 75% by volume, and still more preferably 20 to 70% by volume. If the content of the phosphor is too small, a desired luminescence intensity is less likely to be obtained. On the other hand, if the content of the phosphor is too large, the mechanical strength of the phosphor layer 1 is likely to be decreased.

The phosphor layer 1 may be free from any inorganic binder or the like, that is, may be a phosphor layer substantially formed of phosphor only and specifically may be a polycrystalline ceramic phosphor. Because polycrystalline ceramic phosphors are especially excellent in thermal resistance, they are less likely to cause melting and other inconveniences even when reaching a high temperature owing to increase in the power of excitation light. Examples of polycrystalline ceramic phosphors that can be cited include, for example, garnet-based ceramic phosphors, such as YAG ceramic phosphor. The phosphor layer 1 made of a polycrystalline ceramic phosphor and the light-transmissive heat dissipation layer 2 (for example, one formed of a light-transmissive ceramic substrate) are preferably bonded together by spark plasma sintering. In this manner, the adhesion between the phosphor layer 1 and the light-transmissive heat dissipation layer 2 becomes good, so that heat generated in the phosphor layer 1 is likely to be transferred to the light-transmissive heat dissipation layers 2.

The thickness of the phosphor layer 1 is preferably small to the extent that excitation light can be surely absorbed into the phosphor. Reasons for this include that if the phosphor layer 1 is too thick, scattering and absorption of light in the phosphor layer 1 may become too much, resulting in a tendency of the efficiency of emission of fluorescence to decrease, and that the temperature of the phosphor layer 1 becomes high, thus easily causing a decrease in luminescence intensity with time and melting of a component material. Therefore, the thickness of the phosphor layer 1 is preferably not more than 1 mm, more preferably not more than 0.5 mm, and still more preferably not more than 0.3 mm. The lower limit of the thickness of the phosphor layer 1 is generally about 0.03 mm.

The light-transmissive heat dissipation layer 2 has a higher thermal conductivity than the phosphor layer 1. Specifically, the thermal conductivity is preferably 5 W/m·K or more, more preferably 10 W/m·K or more, and still more preferably 20 W/m·K or more. Furthermore, the light-transmissive heat dissipation layer 2 transmits excitation light and fluorescence emitted from the phosphor layer 1. Specifically, the total light transmittance of the light-transmissive heat dissipation layer 2 for wavelengths of 400 to 800 nm is preferably 10% or more, more preferably 20% or more, still more preferably 30% or more, particularly preferably 40% or more, and most preferably 50% or more.

Examples of the light-transmissive heat dissipation layer 2 that can be cited include light-transmissive ceramic substrates made of aluminum oxide-based ceramics, zirconia oxide-based ceramics, aluminum nitride-based ceramics, silicon carbide-based ceramics, boron nitride-based ceramics, magnesium oxide-based ceramics, titanium oxide-based ceramics, niobium oxide-based ceramics, zinc oxide-based ceramics, yttrium oxide-based ceramics or like ceramics.

The thickness of the light-transmissive heat dissipation layer 2 is preferably 0.05 to 1 mm, more preferably 0.07 to 0.8 mm, and still more preferably 0.1 to 0.5 mm. If the thickness of the light-transmissive heat dissipation layer 2 is too small, the mechanical strength tends to be decreased. On the other hand, if the thickness of the light-transmissive heat dissipation layer 2 is too large, the light emitting device tends to be large in size.

The two light-transmissive heat dissipation layers 2 provided on both surfaces of the phosphor layer 1 may have equal thicknesses or different thicknesses. For example, if the mechanical strength for the wavelength conversion member is secured by providing one of the light-transmissive heat dissipation layers 2 with a relatively large thickness (for example, 0.2 mm or more or even 0.5 mm or more), the other light-transmissive heat dissipation layer 2 may be provided with a relatively small thickness (for example, less than 0.2 mm or even 0.1 mm or less).

An antireflection film or a bandpass filter may be provided on an incident surface of the light-transmissive heat dissipation layer 2 through which excitation light enters the light-transmissive heat dissipation layer 2, for the purposes of reducing the reflection loss of the excitation light and improving the forward extraction of fluorescence. Furthermore, an antireflection film may be provided on an exit surface of the light-transmissive heat dissipation layer 2 through which the excitation light and the fluorescence exit the light-transmissive heat dissipation layer 2, for the purpose of reducing the reflection loss of the excitation light and the fluorescence.

The wavelength conversion member 11 can be produced, for example, in the following manner.

A green sheet for a phosphor layer 1 is produced by applying a slurry containing glass powder, a phosphor, and organic components such as a binder resin and a solvent to a resin film made of polyethylene terephthalate or other materials by the doctor blade method or other methods and then drying the slurry by the application of heat. The green sheet is fired, thus obtaining a phosphor layer 1.

Light-transmissive heat dissipation layers 2 are deposited on both surfaces of the phosphor layer 1 and bonded together by the application of heat and pressure, thus obtaining a wavelength conversion member 11. Alternatively, the phosphor layer 1 and the light-transmissive heat dissipation layers 2 may be bonded together with an inorganic adhesive, such as polysilazane.

(2) Wavelength Conversion Member According to Second Embodiment

FIG. 2 is a schematic cross-sectional view showing a wavelength conversion member according to a second embodiment of the present invention. The wavelength conversion member 12 is formed of a laminate 3 in which two phosphor layers 1 and three light-transmissive heat dissipation layers 2 are alternately stacked. In this embodiment, since the wavelength conversion member 12 has two phosphor layers 1, the luminescence intensity can be increased. Simultaneously, since the three light-transmissive heat dissipation layers 2 and the phosphor layers 1 are alternatively stacked, the path along which heat generated in the phosphor layers 1 is released to the outside can be sufficiently secured, thus reducing the temperature rise of the phosphor layers 1. Note that heat transferred to the light-transmissive heat dissipation layer 2 located inside the laminate 3 is released from the edges of the light-transmissive heat dissipation layer 2 to the outside. The wavelength conversion member 12 according to this embodiment is, like the wavelength conversion member 11 according to the first embodiment, a transmissive wavelength conversion member.

Although in this embodiment the wavelength conversion member 12 is formed of a laminate in which two phosphor layers 1 and three light-transmissive heat dissipation layers 2 are alternately stacked, it may be formed of a laminate in which three or more phosphor layers 1 and four or more light-transmissive heat dissipation layers 2 are alternately stacked. In this case, the luminescence intensity of the wavelength conversion member 12 can be further increased while the temperature rise of the phosphor layers 1 can be reduced.

The thicknesses of the phosphor layers 1 may be equal to or different from each other. While passing through the wavelength conversion member 12 from the incident surface to the exit surface, the excitation light is gradually diffused thereinto and, therefore, its energy tends to gradually decrease. To cope with this, the phosphor layer 1 close to the incident surface through which the excitation light enters is provided with a relatively small thickness and the other phosphor layers 1 are provided with larger thicknesses toward the exit surface through which the excitation light exits. Thus, it is possible to homogenize the amounts of heat generated in the phosphor layers 1.

Furthermore, the contents of phosphor in the phosphor layers 1 may also be equal to or different from each other. The phosphor layer 1 close to the incident surface through which the excitation light enters is provided with a relatively small content of phosphor and the other phosphor layers 1 are provided with larger contents of phosphor toward the exit surface through which the excitation light exits. Thus, it is possible to homogenize the amounts of heat generated in the phosphor layers 1.

The types of phosphors in the phosphor layers 1 may be equal to or different from each other. If different types of phosphors are used in the individual phosphor layers 1, the luminescent color can be controlled.

Both of a phosphor layer formed of phosphor powder dispersed in an inorganic binder and a phosphor layer made of a polycrystalline ceramic phosphor may be provided as the phosphor layers 1. Because the phosphor layer made of a polycrystalline ceramic phosphor is especially excellent in thermal resistance, it is preferably provided on the incident surface side where the excitation light enters. In this case, because the excitation light having passed through the phosphor layer made of a polycrystalline ceramic phosphor is reduced in light intensity per unit area owing to scattering, the inconvenience can be reduced that when the excitation light then enters the phosphor layer formed of phosphor powder dispersed in the inorganic binder, the inorganic binder melts. Furthermore, by appropriately changing the content or type of phosphor powder in the phosphor layer formed of the phosphor powder dispersed in an inorganic powder, the color tone and the luminescence intensity can be easily controlled.

(3) Wavelength Conversion Member According to Third Embodiment

FIG. 3(a) is a schematic cross-sectional view showing a wavelength conversion member according to a third embodiment of the present invention. FIG. 3(b) is a schematic plan view of the wavelength conversion member of FIG. 3(a). The wavelength conversion member 13 is different from the wavelength conversion member 11 according to the first embodiment in that a heat dissipating member 4 is provided to surround the lateral periphery of a laminate 3 formed of a phosphor layer 1 and light-transmissive heat dissipation layers 2. In this embodiment, the laminate 3 is bonded tightly to the inside of a hole 4a provided substantially in the center of the heat dissipating member 4. Heat generated in the phosphor layer 1 is released through the light-transmissive heat dissipation layers 2 to the outside or directly transferred to the heat dissipating member 4 and then released from the heat dissipating member 4 to the outside. In this embodiment, by providing the heat dissipating member 4, heat generated in the phosphor layer 1 can be more efficiently released to the outside. Although in this embodiment the laminate 3 has a columnar shape, it may have a prismatic shape, such as a triangular prism or a quadratic prism.

No particular limitation is placed on the type of the heat dissipating member 4 so long as it has a higher thermal conductivity than the phosphor layer 1. The thermal conductivity of the heat dissipating member 4 is preferably 5 W/m·K or more, more preferably 10 W/m·K or more, still more preferably 20 W/m·K or more, and particularly preferably 50 W/m·K or more. Specific examples of the material for the heat dissipating member 4 include metals, such as aluminum, copper, silver, platinum, and gold, and ceramics, such as aluminum nitride.

Furthermore, by providing the heat dissipating member 4 around the lateral periphery of the laminate 3, the leakage of excitation light L0 and fluorescence L1 from the lateral periphery of the laminate 3 can be reduced, so that the luminescence intensity of the wavelength conversion member 13 can be increased. A reflective layer (not shown) may be provided at the interface between the laminate 3 and the heat dissipating member 4. By doing so, the leakage of excitation light L0 and fluorescence L1 from the lateral periphery of the laminate 3 can be further reduced, so that the luminescence intensity of the wavelength conversion member 13 can be further increased. Examples of the reflective layer that can be cited include metallic layers made of Ag, Al, Pt, Cu or other metals and ceramic layers containing alumina, titania or other ceramics. In order to efficiently transfer heat from the laminate 3 to the heat dissipating member 4, the reflective layer is preferably a metallic layer.

For example, in forming a metallic layer as the reflective layer, the laminate 3 and the heat dissipating member 4 are temporarily bonded using a paste made of a mixture of metal powder as a source material of the metallic layer and a binder resin, and then subjected to heat treatment to remove the binder resin. Alternatively, in forming a ceramic layer as the reflective layer, the laminate 3 and the heat dissipating member 4 are temporarily bonded using a paste made of a mixture of ceramic powder as a source material of the ceramic layer, glass powder, and a resin binder, and then subjected to heat treatment to remove the binder resin and sinter the ceramic powder and the glass powder.

(4) Wavelength Conversion Member According to Fourth Embodiment

FIG. 4(a) is a schematic cross-sectional view showing a wavelength conversion member according to a fourth embodiment of the present invention. FIG. 4(b) is a schematic plan view of the wavelength conversion member 14 of FIG. 4(a) when viewed from an incident surface thereof through which excitation light L0 enters the wavelength conversion member 14 and FIG. 4(c) is a schematic plan view of the wavelength conversion member 14 of FIG. 4(a) when viewed from the opposite side to the incident surface through which excitation light L0 enters the wavelength conversion member 14 (from the exit surface thereof through which excitation light L0 and fluorescence L1 exit the wavelength conversion member 14). The wavelength conversion member 14 according to this embodiment is different from the wavelength conversion member 13 according to the third embodiment in that a scattering layer 5 is provided on an incident surface of a laminate 3 through which excitation light L0 enters the wavelength conversion member 14, the laminate 3 being formed of a phosphor layer 1 and light-transmissive heat dissipation layers 2. By doing so, the excitation light L0 is first scattered in the scattering layer 5 and then applied to the phosphor layer 1, which makes it possible to reduce the energy density of the excitation light L0 applied to the phosphor layer 1. As a result, excessive temperature rise of the phosphor layer 1 can be reduced.

The scattering layer 5 is composed of, for example, a glass matrix and high-refraction inorganic particles dispersed in the glass matrix. Examples of the glass matrix that can be cited include borosilicate-based glasses. Examples of the inorganic particles that can be cited include at least one oxide or nitride selected from the group consisting of Al, Nb, Ti, Ta, La, Zr, Ce, Ga, Mg, Si, and Zn. The content of inorganic particles in the scattering layer 5 is preferably 5 to 80% by volume, more preferably 10 to 70% by volume, and still more preferably 20 to 60% by volume. If the content of inorganic particles is too small, a sufficient scattering effect is less likely to be obtained. On the other hand, if the content of inorganic particles is too large, the excitation light is less likely to penetrate the scattering layer 5, so that the luminescence intensity of the wavelength conversion member 14 is likely to be decreased.

The scattering layer 5 can be produced in the following manner. A green sheet for a scattering layer 5 is produced by applying a slurry containing glass powder to be a glass matrix, inorganic particles, and organic components such as a binder resin and a solvent to a resin film made of polyethylene terephthalate or other materials by the doctor blade method or other methods and then drying the slurry by the application of heat. The green sheet is fired, thus obtaining a scattering layer 5.

(5) Wavelength Conversion Member According to Fifth Embodiment

FIG. 5 is a schematic cross-sectional view showing a wavelength conversion member according to a fifth embodiment of the present invention. The wavelength conversion member 15 includes a phosphor layer 1, light-transmissive heat dissipation layers 2 formed on both surfaces of the phosphor layer 1, and a reflective layer 6 formed on a surface of one of the light-transmissive heat dissipation layers 2. The wavelength conversion member 15 according to this embodiment is a reflective wavelength conversion member. When the light-transmissive heat dissipation layer 2 on which the reflective layer 6 is not formed is irradiated with excitation light, the incident excitation light is converted in wavelength to fluorescence by the phosphor layer 1. The fluorescence is reflected on the reflective layer 6 and then radiated to the outside through the same light-transmissive heat dissipation layer 2 as that through which the light has entered. Alternatively, part of the excitation light having entered the wavelength conversion member 15 is converted in wavelength to fluorescence by the phosphor layer 1. The fluorescence is, together with part of the excitation light not converted in wavelength, reflected on the reflective layer 6 and then radiated to the outside through the same light-transmissive heat dissipation layer 2 as that through which the light has entered.

An example of the reflective layer 6 that can be cited is a metallic layer, a dielectric multi-layer or a reflective glass layer.

An example of the metallic layer that can be cited is a substrate or thin film made of silver, aluminum or platinum. Examples of a method for forming a thin metal film that can be cited include plating as well as vacuum deposition, ion plating, and sputtering which are physical vapor deposition methods. Alternatively, a thin silver film can be formed by applying a paste of silver clay on the light-transmissive heat dissipation layer 2 and applying heat to the paste.

The dielectric multi-layer has a structure formed by alternately depositing low-refractive index layers made of silicon oxide or the like and high-refractive index layers made of niobium oxide, titanium oxide, lanthanum oxide, tantalum oxide, yttrium oxide, gadolinium oxide, tungsten oxide, hafnium oxide, aluminum oxide, silicon nitride or the like. Examples of a method for forming a dielectric multi-layer that can be cited include vacuum deposition, ion plating, and sputtering.

The reflective glass layer is composed of, for example, a glass matrix and high-refraction inorganic particles dispersed in the glass matrix. Examples of the glass matrix that can be cited include borosilicate-based glasses. Examples of the inorganic particles that can be cited include at least one oxide or nitride selected from the group consisting of Al, Nb, Ti, Ta, La, Zr, Ce, Ga, Mg, Si, and Zn.

The reflective glass layer can be produced in the following manner. A green sheet for a reflective glass layer is produced by applying a slurry containing glass powder to be a glass matrix, inorganic particles, and organic components such as a binder resin and a solvent to a resin film made of polyethylene terephthalate or other materials by the doctor blade method or other methods and then drying the slurry by the application of heat. The green sheet is fired, thus obtaining a reflective glass layer.

(6) Wavelength Conversion Member According to Sixth Embodiment

FIG. 6(a) is a schematic cross-sectional view showing a wavelength conversion member according to a sixth embodiment of the present invention. FIG. 6(b) is a schematic plan view of the wavelength conversion member 16 of FIG. 6(a) when viewed from the opposite side to an incident surface thereof through which excitation light L0 enters the wavelength conversion member 16 and FIG. 6(c) is a schematic plan view of the wavelength conversion member 16 of FIG. 6(a) when viewed from the incident surface thereof through which excitation light L0 enters the wavelength conversion member 16. The wavelength conversion member 16 is different from the wavelength conversion member 15 according to the fifth embodiment in that a heat dissipating member 4 is provided to surround the lateral periphery of a laminate 3 formed of a phosphor layer 1 and light-transmissive heat dissipation layers 2. In this embodiment, the laminate 3 is bonded tightly to the inside of a hole 4a provided substantially in the center of the heat dissipating member 4. Heat generated in the phosphor layer 1 is released through the light-transmissive heat dissipation layer 2 to the outside or directly transferred to the heat dissipating member 4 and then released from the heat dissipating member 4 to the outside. In this embodiment, by providing the heat dissipating member 4, the heat generated in the phosphor layer 1 can be more efficiently released to the outside. Although in this embodiment the laminate 3 has a columnar shape, it may have a prismatic shape, such as a triangular prism or a quadratic prism. Furthermore, a reflective layer (not shown) may be provided at the interface between the laminate 3 and the heat dissipating member 4.

(7) Wavelength Conversion Member According to Seventh Embodiment

FIG. 7(a) is a schematic cross-sectional view showing a wavelength conversion member according to a seventh embodiment of the present invention. FIG. 7(b) is a schematic plan view of the wavelength conversion member 17 of FIG. 7(a) when viewed from the opposite side to an incident surface thereof through which excitation light L0 enters the wavelength conversion member 17 and FIG. 7(c) is a schematic plan view of the wavelength conversion member 17 of FIG. 7(a) when viewed from the incident surface thereof through which excitation light L0 enters the wavelength conversion member 17. The wavelength conversion member 17 according to this embodiment is different from the wavelength conversion member 16 according to the sixth embodiment in that a scattering layer 5 is provided on an incident surface of a laminate 3 through which excitation light L0 enters the wavelength conversion member 17, the laminate 3 being formed of a phosphor layer 1 and light-transmissive heat dissipation layers 2. By doing so, the excitation light L0 is first scattered in the scattering layer 5 and then applied to the phosphor layer 1, which makes it possible to reduce the energy density of the excitation light L0 applied to the phosphor layer 1. As a result, excessive temperature rise of the phosphor layer 1 can be reduced.

(8) Light Emitting Device Using Wavelength Conversion Member According to First Embodiment FIG. 8 is a schematic side view of a light emitting device in which the wavelength conversion member according to the first embodiment of the present invention is used. The light emitting device according to this embodiment is a light emitting device in which a transmissive wavelength conversion member is used. As shown in FIG. 8, the light emitting device 21 includes a wavelength conversion member 11 and a light source 7. Excitation light L0 emitted from the light source 7 is converted in wavelength to fluorescence L1 having a longer wavelength than the excitation light L0 by the phosphor layer 1 in the wavelength conversion member 11. Furthermore, part of the excitation light L0 passes through the wavelength conversion member 11. Therefore, the wavelength conversion member 11 emits synthetic light L2 composed of the excitation light L0 and the fluorescence L1. For example, when the excitation light L0 is a blue light and the fluorescence L1 is a yellow light, a white synthetic light L2 can be provided.

In the light emitting device 21, the wavelength conversion member 11 is formed of a laminate 3 that includes: a phosphor layer 1; and light-transmissive heat dissipation layers 2 formed on both surfaces of the phosphor layer 1. Therefore, heat generated by the irradiation of the phosphor layer 1 with the excitation light L0 is released through the light-transmissive heat dissipation layers 2 to the outside. Thus, an undue temperature rise of the phosphor layer 1 can be reduced.

Examples of the light source 7 that can be cited include an LED and an LD. From the viewpoint of increasing the luminescence intensity of the light emitting device 21, an LD capable of emitting high-intensity light is preferably used as the light source 7.

Note that instead of the wavelength conversion member 11 according to the first embodiment, any one of the wavelength conversion members 12 to 15 according to the second to fifth embodiments may be used.

(9) Light Emitting Device Using Wavelength Conversion Member According to Fifth Embodiment FIG. 9 is a schematic side view of a light emitting device in which the wavelength conversion member according to the fifth embodiment of the present invention is used. The light emitting device according to this embodiment is a light emitting device in which a reflective wavelength conversion member is used. As shown in FIG. 9, the light emitting device 22 includes a wavelength conversion member 15, a light source 7, and a beam splitter 8. Light L0 emitted from the light source 7 is guided to the wavelength conversion member 15 by the beam splitter 8 and then converted in wavelength to light L1 having a longer wavelength than the light L0 by the phosphor layer 1 in the wavelength conversion member 15. The light L1 is reflected toward the incident surface side by the reflective layer 6, passes through the beam splitter 8, and is then emitted to the outside.

Also in the light emitting device 22 according to this embodiment, light-transmissive heat dissipation layers 2 are formed on both surfaces of the phosphor layer 1 in the wavelength conversion member 15. Therefore, heat generated by the irradiation of the phosphor layer 1 with the excitation light L0 is released through the light-transmissive heat dissipation layers 2 to the outside. Thus, an undue temperature rise of the phosphor layer 1 can be reduced.

INDUSTRIAL APPLICABILITY

The wavelength conversion member of the present invention is suitable as a component of a general lighting, such as a white LED, or a special lighting (for example, a light source for a projector, a light source for a vehicle headlight or a light source for an endoscope).

REFERENCE SIGNS LIST

1 . . . phosphor layer
2 . . . light-transmissive heat dissipation layer
3 . . . laminate
4 . . . heat dissipating member
5 . . . scattering layer
6 . . . reflective layer
7 . . . light source
8 . . . beam splitter
11, 12, 13, 14, 15, 16, 17 . . . wavelength conversion member
21, 22 . . . light emitting device

The invention claimed is:

1. A wavelength conversion member comprising a laminate that includes:
   a phosphor layer; and
   light-transmissive heat dissipation layers formed on both surfaces of the phosphor layer and having a higher thermal conductivity than the phosphor layer.

2. The wavelength conversion member according to claim 1, wherein the phosphor layer includes two or more phosphor layers and the light-transmissive heat dissipation layers include three or more light-transmissive heat dissipation layers that are alternately stacked.

3. The wavelength conversion member according to claim 1, wherein the light-transmissive heat dissipation layer is made of a light-transmissive ceramic.

4. The wavelength conversion member according to claim 3, wherein the light-transmissive ceramic is at least one selected from the group consisting of an aluminum oxide-based ceramic, a zirconia oxide-based ceramic, an aluminum nitride-based ceramic, a silicon carbide-based ceramic, a boron nitride-based ceramic, a magnesium oxide-based ceramic, a titanium oxide-based ceramic, a niobium oxide-based ceramic, a zinc oxide-based ceramic, and a yttrium oxide-based ceramic.

5. The wavelength conversion member according to claim 1, wherein the phosphor layer is formed of phosphor powder dispersed in an inorganic binder.

6. The wavelength conversion member according to claim 1, wherein the phosphor layer is made of a polycrystalline ceramic phosphor.

7. The wavelength conversion member according to claim 2, wherein the two or more phosphor layers include a layer formed of phosphor powder dispersed in an inorganic binder and a layer made of a polycrystalline ceramic phosphor.

8. The wavelength conversion member according to claim 1, wherein a heat dissipating member having a higher thermal conductivity than the phosphor layer is provided on a lateral periphery of the laminate.

9. The wavelength conversion member according to claim 8, wherein the heat dissipating member is made of a metal or a ceramic.

10. The wavelength conversion member according to claim 8, wherein a reflective layer is provided at the interface between the laminate and the heat dissipating member.

11. The wavelength conversion member according to claim 1, wherein a scattering layer is provided on an incident surface of the laminate through which the excitation light enters the laminate.

12. The wavelength conversion member according to claim 1, wherein a reflective layer is formed on one outermost surface of the laminate opposite to the other outermost surface through which the excitation light enters the laminate.

13. The wavelength conversion member according to claim 12, wherein the reflective layer is a metallic layer, a dielectric multi-layer or a reflective glass layer.

14. A light emitting device comprising: the wavelength conversion member according to claim 1; and a light source operable to irradiate the wavelength conversion member with excitation light.

15. The light emitting device according to claim 14, wherein the light source is a laser diode.

* * * * *